US009647800B2

(12) United States Patent
Lucani et al.

(10) Patent No.: US 9,647,800 B2
(45) Date of Patent: May 9, 2017

(54) FULCRUM NETWORK CODES

(71) Applicant: AALBORG UNIVERSITET, Aalborg (DK)

(72) Inventors: Daniel E. Lucani, Hobro (DK); Morten V. Pedersen, Aalborg (DK); Janus Heide, Aalborg (DK); Frank H. P. Fitzek, Berlin (DE)

(73) Assignee: AALBORG UNIVERSITET, Aalborg (DK)

( * ) Notice: Subject to any disclaimer, the term of this patent is extended or adjusted under 35 U.S.C. 154(b) by 285 days.

(21) Appl. No.: 14/242,086

(22) Filed: Apr. 1, 2014

(65) Prior Publication Data

US 2015/0281406 A1 Oct. 1, 2015

(51) Int. Cl.
*H04J 3/18* (2006.01)
*H04H 20/71* (2008.01)
*H04L 27/00* (2006.01)
*H04L 25/03* (2006.01)
*G06F 15/16* (2006.01)
*H04L 1/00* (2006.01)
*H03M 13/29* (2006.01)
(Continued)

(52) U.S. Cl.
CPC .......... *H04L 1/0065* (2013.01); *H03M 13/29* (2013.01); *H03M 13/3761* (2013.01); *H04L 1/0057* (2013.01); *H03M 13/1515* (2013.01); *H04L 2001/0093* (2013.01)

(58) Field of Classification Search
CPC ................. H04L 1/0065; H04L 1/0057; H04L 2001/0093; H03M 13/29; H03M 13/3761; H03M 13/1515
See application file for complete search history.

(56) References Cited

U.S. PATENT DOCUMENTS

2010/0265865 A9* 10/2010 Vijayan .................... H04B 7/12
370/312
2012/0063533 A1* 3/2012 Fonseka ................ H04L 1/0051
375/295
(Continued)

OTHER PUBLICATIONS

Abdrashitov, et al.; "Sparse Random Linear Network Codes;" http://surat.teerapittayanon.info/ncsim.pdf; Dec. 21, 2011; pp. 1-20.
(Continued)

*Primary Examiner* — Kiet Tang
(74) *Attorney, Agent, or Firm* — Daly, Crowley, Mofford & Durkee, LLP

(57) ABSTRACT

Fulcrum network codes, which are a network coding framework, achieve three objectives: (i) to reduce the overhead per coded packet to almost 1 bit per source packet; (ii) to operate the network using only low field size operations at intermediate nodes, dramatically reducing complexity in the network; and (iii) to deliver an end-to-end performance that is close to that of a high field size network coding system for high-end receivers while simultaneously catering to low-end ones that can only decode in a lower field size. Sources may encode using a high field size expansion to increase the number of dimensions seen by the network using a linear mapping. Receivers can tradeoff computational effort with network delay, decoding in the high field size, the low field size, or a combination thereof.

15 Claims, 10 Drawing Sheets

(51) Int. Cl.
H03M 13/37 (2006.01)
H03M 13/15 (2006.01)

(56) References Cited

U.S. PATENT DOCUMENTS

2014/0233673 A1* 8/2014 Smith .................. H04L 1/0042
375/296
2014/0379858 A1* 12/2014 Mahdaviani ............ H04L 67/02
709/217

OTHER PUBLICATIONS

Ahlswede, et al.; "Network Information Flow;" IEEE Transactions on Information Theory; vol. 46, No. 4; Jul. 2000; pp. 1204-1216.
Dimakis, et al.; "A Survey on Network Codes for Distributed Storage;" Proceedings of the IEEE; vol. 99; No. 3; Mar. 2011; pp. 476-489.
Elias, et al.; "A Note on the Maximum Flow Through a Network;" IRE Transactions on Information Theory; vol. 2; No. 4; pp. 117-119; Jan. 1956.
Feizi, et. al.; "Tunable Sparse Network Coding;" Int. Zurich Seminar on Communications (IZS); Feb. 29-Mar. 2, 2012 pp. 107-110.
Forney; "Concatenated Codes;" Technical Report 440; Massachusetts Institute of Technology; Dec. 1, 1965; 116 pages.
Gkantisidis, et al.; Comprehensive View of a Live Network Coding P2P Systems; Proceedings of the $6^{th}$ ACM SIGCOMM conference on Internet measurement, ser. IMC '06; Oct. 25-27, 2006; 11 pages.
Heide, et al.; "Network Coding for Mobile Devices—Systematic Binary Random Rateless Codes," IEEE Int. Conf. on Comm. (ICC) Workshops, Jan. 2009; pp. 1-6.
Heide, et al.; "On Code Parameters and Coding Vector Representation for Practical RLNC;" IEEE Int. Conf. on Comm. (ICC) Workshops, Jan. 2011; pp. 1-5.
Ho, et al.; "A Random Linear Network Coding Approach to Multicast;" IEEE Transactions on Information Theory, vol. 52; No. 10; Oct. 2006; pp. 4413-4430.
Karande, et al.; "Multicast Throughput Order of Network Coding in Wireless Ad-hoc Networks;" IEEE Transactions on Communications; Jan. 2010; pp. 1-10.
Katti, et al.; "XORs in the Air: Practical Wireless Network Coding;" IEEE/ACM Transactions on Networking; vol. 16; No. 3; Jun. 2008; pp. 497-510.
Kim; "Concatenated Network Coding for Large-Scale Multi-Hop Wireless Networks;" IEEE Wireless Communications and Networking Conference (WCNC) Jan. 2007; pp. 986-990.
Lee, et al.; "On Jacket Transforms Over Finite Fields;" IEEE International Symposium on Information Theory (ISIT); Jun. 28-Jul. 3, 2009; pp. 2803-2807.
Li, et al.; "Linear Network Coding;" IEEE Transactions on Information Theory; vol. 49; No. 2; Feb. 2003; pp. 371-381.
Lucani, et al.; "Random Linear Network Coding for Time-Division Duplexing: Field Size Considerations;" IEEE Global Telecom Conf. (GLOBECOM), Jan. 2009; 6 pages.
Maymounkov; "Perpetual Codes: Cache-friendly Coding;" Unpublished draft; retrieved Sep. 2, 2011 (Online); http://dos.csail.mit.edu/~petar/papers/maymounkov-perpetual.ps; Jan. 2006; 34 pages.
Nistor, et al.; "A Total Energy Approach to Protocol Design in Coded Wireless Sensor Networks;" 2012 International Symposium on Network Coding (NetCod); Jan. 2012; pp. 31-36.
Nistor, et al.; "On the Delay Distribution of Random Linear Network Coding;" IEEE Journal on Selected Areas in Communications; vol. 29; No. 5; May 2011; pp. 1084-1093.
Pedersen, et al.; "Kodo: An Open and Research Oriented Network Coding Library," Lecture Notes in Computer Science; vol. 6827; Jan. 2011; pp. 145-152.
Pedersen, et al.; "Picture Viewer—A Mobile Application Using Network Coding;" European Wireless Conference (EW); Jan. 2009; pp. 151-156.

Prior, et al.; "Network Coding Protocols for Smart Grid Communications;" IEEE Transactions on Smart Grid; Jan. 2014; pp. 1-9.
Qualcomm; Raptorq—The Superior FEC Technology; (Online); http://www.qualcomm.com/media/documents/raptorq-data-sheet; Dec. 2013.
Seferoglu, et al.; "Video-Aware Opportunistic Network Coding over Wireless Networks;" IEEE Journal on Selected Areas in Communications; vol. 27; No. 5; Jun. 2009; pp. 713-728.
Shokrollahi; "Raptor Codes;" IEEE Transactions on Information Theory; vol. 52; No. 6; Jun. 2006; pp. 2551-2567.
Steinwurf ApS. (2012) Kodo Git repository on github, http://github.com/Steinwurf/kodo.
Thibault, et al.; "A Family of Concatenated Network Codes for Improved Performance with Generations;" Journal of Communications and Networks; vol. 10; No. 4; Dec. 2008; pp. 384-395.
Thomos, et al.; "Toward One Symbol Network Coding Vectors;" IEEE Communications Letters; vol. 16; No. 11; Nov. 2012; pp. 1860-1863.
Vilela, et al.; "Lightweight Security for Network Coding;" IEEE Int'l Conf. on Communications (ICC); Jan. 2008; pp. 1750-1754.
Vingelmann, et al.; "Synchronized Multimedia Streaming on the iphone Platform with Network Coding;" IEEE Communications Magazine; vol. 49; No. 6; Jun. 2011; pp. 126-132.
Yin, et al.; "Performance of Random Linear Network Codes Concatenated with Reed-Solomon Codes using Turbo Decoding;" 2010 $6^{th}$ International Symposium on Turbo Codes & Iterative Information Processing; (ISTC); Jan. 2010; pp. 132-136.
Zhang, et al.; "P-Coding: Secure Network Coding against Eavesdropping Attacks;" IEEE INFOCOM; Jan. 2010; pp. 1-9.
Zhao, et al.; "Comparison of Analytical and Measured Performance Results on Network Coding in IEEE 802.11 Ad-Hoc Networks;" 2012 International Symposium on Network Coding (NetCod); Jan. 2012; pp. 43-48.
Zhao, et al.; "On analyzing and improving COPE performance;" Info. Theory and App. Workshop (ITA); Jan. 2010; pp. 1-6.
Heide et al., "Decoding Algorithms for Random Linear Network Codes;" Conference Paper from Networking 2011 Workshop, vol. 6827 of the series Lecture Notes in Computer Science; May 13, 2011; 8 Pages.
Heide et al., "A Perpetual Code for Network Coding;" in IEEE Vehicular Technology Conference (VTC)—Wireless Networks and Security Symposium; 2013; 6 Pages.
Ho et al., "The Benefits of Coding Over Routing in a Randomized Setting;" Proceedings of the IEEE International Symposium on Information Theory (ISIT); Jun. 29, 2003; 6 Pages.
Chou et al., "Practical Network Coding;" Allerton Conference on Communication Control and Computing, vol. 4; 2003; 10 Pages.
Trullols-Cruces et al., "Exact Decoding Probability Under Random Linear Network Coding;" IEEE Communications Letters, vol. 15, No. 1; Jan. 2011; 3 Pages.
Li et al., "Singularity Probability Analysis for Sparse Random Linear Network Coding;" IEEE International Conference on Communications (ICC); Jun. 2011; 5 Pages.
Gunther et al., "Efficient GF Arithmetic for Linear Network Coding using Hardware SIMD Extensions;" International Symposium on Network Coding (NetCod); Jul. 2014; 7 Pages.
Fragouli et al., "Network Coding: An Instant Primer;" SIGCOMM Computer Communications Review, vol. 36, No. 1; Jan. 2006; 6 Pages.
Lucani et al., "On Coding for Delay—Network Coding for Time-Division Duplexing;" IEEE Transactions on Information Theory, vol. 58, No. 4; Apr. 2012; 19 Pages.
Jaggi et al., "Polynomial Time Algorithms for Multicast Network Code Construction;" IEEE Transactions on Information Theory, vol. 51, No. 6; Jun. 2005; 10 Pages.
U.S. Appl. No. 14/948,414, filed Nov. 23, 2015, Heide et al.
Lucani et al., "Coping with the Upcoming Heterogeneity in 5G Communications and Storage Using Fulcrum Network Codes;" Proceedings of the International Symposium on Wireless Communication Systems (ISWCS); Aug. 2014; 5 Pages.

(56) References Cited

OTHER PUBLICATIONS

Paramanathan et al., "Lean and Mean: Network Coding for Commercial Devices;" IEEE Wireless Communications, vol. 20, No. 5; Oct. 2013; 14 Pages.

* cited by examiner

FULCRUM NETWORK CODES

BACKGROUND

As is known in the art, network coding (NC) is a technique which, ideally, can be used to achieve network capacity in multicast sessions. NC utilizes a store-code-forward paradigm to network operation in which intermediate nodes (i.e. nodes between a source node and a destination node) in a network can mix (or recode) data packets, essentially extending the set of functions assigned to intermediate nodes to include coding operations.

As is also known, linear network codes have been shown to be sufficient to achieve multicast capacity in multicast sessions. Moreover, random linear network codes (RLNC), which allow intermediate nodes to choose random coefficients to create linear combinations of incoming packets, have been shown as a simple, distributed, and asymptotically optimal approach.

NC techniques have shown significant gains (e.g. in terms of improved performance and/or energy efficiency) in a multitude of applications ranging from wireless networks and multimedia transmission, to distributed storage and peer-to-peer (P2P) networks.

SUMMARY

It is appreciated herein that network coding (NC) assimilation has been limited by the complexity it introduces into network devices, both in wireline and wireless networks. This complexity is driven by two factors. First, network devices must perform additional processing, which may limit any energy efficiency benefits. This processing can also become a bottleneck in the system's overall throughput if processing is slower than the incoming/outgoing data links. Beyond the computational burden, the use of higher field sizes comes at the cost of a higher signaling overhead. This overhead is needed to communicate the coefficients used for coding the data packets. Other alternatives, e.g., sending a seed for a pseudo-random number generator (PRNG), are relevant end-to-end but do not allow for simple recoding.

Second, devices must support different configurations for each application or data flow, e.g., different field sizes for the underlying arithmetic, to achieve a target performance. Supporting disparate configurations translates into high costs in hardware, firmware, or software. In computationally constrained devices, e.g., sensors, the support for encoding, recoding, or decoding in higher fields is prohibitive due to the large processing effort required. On the other end of the spectrum, computationally powerful devices may also be unable to support multiple configurations. For example, high-load, high-speed Internet routers would require deep packet inspection to determine the coding configuration, followed by a different treatment of each incoming packet. This translates into additional expensive hardware to provide high-processing speeds. Additionally, intermediate nodes in a typical network are heterogeneous in nature, which limits existing system's viable configurations.

One solution to the compatibility and complexity challenges is to limit sources, intermediate nodes, and receivers to use only a finite field (also referred to as a Galois field) of two elements (denoted as GF(2)). However, using only GF(2) may not allow higher-end devices to achieve the highest reliability and throughput performance of which the devices are capable. Thus, there is a need to provide a single, easily implementable, and compatible network infrastructure that supports flows with different end-to-end requirements.

In one aspect, the concepts described herein are directed toward a method for use in a network having at least a first node and a second node. The method comprises receiving a plurality (n) of source packets; encoding the plurality of source packets, using an outer code, to generate a plurality of outer-coded packets and one or more (r) expansion packets, the outer code having a first field size; encoding the outer-coded packets and the expansion packets, using an inner code, to generate a plurality of inner-coded packets, the inner code having a second field size, wherein the second field size is not necessarily equal to the first field size; and transmitting the inner-coded packets from the first node to the second node. In some embodiments, the first field size and the second field size are powers of two. In one embodiment for example, the inner code may use GF(2) whereas the outer code may use GF($2^h$). In some embodiments, the outer code and/or the inner code are systematic codes.

With this particular arrangement, a framework (referred to herein as "Fulcrum network codes," or more simply as "Fulcrum codes") is provided that reduces overhead per coded packet, operates using only GF(2) at intermediate nodes, and delivers end-to-end performance that is close to that of a large field size network coding system for high-end receivers. Simultaneously, the framework caters to low-end receivers using a tunable and straightforward pre-coding mechanism. Moreover, the framework is easily implementable and supports flows with different end-to-end requirements. The bit-by-bit XOR operations of GF(2) in the network are easy and cost-effective to implement in software/hardware and also energy efficient because they require little processing. Their simplicity makes them compatible with almost any device and can be processed at high-speed. As the inner code is in GF(2), its encoding vector can easily be represented compactly, which solves the challenge associated with enabling recoding when a high field size is used.

In addition, by exploiting one code in the network and a different underlying code end-to-end, the framework provides senders and receivers with the flexibility to control their service requirements while making the network agnostic to each flows' characteristics. This has another benefit: new designs and services can be incorporated with minimal or no effort from the network operator, while maintaining backward compatibility to previous solutions.

In some embodiments, the inner code comprises a Random Linear Network Code (RLNC), a Perpetual network code, a tunable sparse network code, or other well-known types of codes. With these particular arrangements, the framework is compatible with existing network infrastructure.

In some embodiments, the outer code is based upon a shared secret between two or more nodes (e.g. the first node and the second node). The shared secret may comprise a linear coefficient matrix or a pseudo-random seed. With this arrangement, the framework provides a simple way to add security in terms of end-to-end data confidentiality. Moreover, it will be appreciated after reading the present disclosure that the framework provides security without the need to run Gaussian elimination twice at the time of decoding and, as a consequence, does not need to trade-off field size and generation size (and thus security) for overhead in the network and complexity.

In some embodiments, the method further comprises receiving a plurality of packets transmitted from the first node. In some embodiments, wherein the number of received packets is greater than or equal to n and less than n+r, the received packets are decoded using the outer code to recover the source packets. In another embodiment, wherein the number of received packets is greater than or equal to n+r, the received packets are decoded using the inner code to recover the source packets. In yet another embodiment, the received packets are decoded using a hybrid of the inner code and the outer code. Here, the received packets are first decoded using the inner code. After a predetermined number (greater than n and less than n+r) of linearly independent packets are received, the received packets are decoded using the outer code.

In some embodiments, the method further comprises receiving a plurality of packets transmitted from the first node, recoding the received packets, and transmitting the recoded packets to a third node in the network. In some embodiments, the recoding comprises encoding the received packets using the inner code to generate a plurality of recoded packets. In other embodiments, the recoding comprises decoding the plurality of packets using the outer code to recover a plurality of the source packets, and encoding the recovered packets using the outer code and the inner code to generate a plurality of recoded packets. In some embodiments, the method uses recoding and/or re-encoding techniques.

With this particular arrangement, the network coding framework provided herein allows recoding to be performed exclusively over the inner code. Alternatively, recoding can be performed using the outer code or a hybrid of the outer code and inner code.

In another aspect of the invention, a network including a source node is provided. The source node comprises an outer encoder configured to receive a plurality of source packets and to encode the source packets, using an outer code, to generate one or more expansion packets, the outer code having a first field size; and an inner encoder to encode the source packets and the expansion packets, using an inner code, to generate a plurality of transmission packets, the inner code having a second field size, wherein the second field size is not necessarily equal to the first field size.

In some embodiments, the network further includes a receiver node. The receiver node comprises a decoder configured to receive a plurality of packets transmitted from the source node and to decode the received packets to recover the source packets. The decoder uses the outer code, the inner code, or a hybrid of the outer and inner codes to recover the source packets.

In some embodiments, the network further includes an intermediate node. The intermediate node comprises a recoder configured to receive a plurality of packets transmitted from the source node and to receive the received packets. The recoder uses the outer code, the inner code, or a hybrid of the outer and inner codes. The recoded packets are transmitted to a receiver node.

BRIEF DESCRIPTION OF THE DRAWINGS

Various embodiments of the concepts, structures, and techniques sought to be protected herein may be more fully understood from the following detailed description of the drawings, in which.

DETAILED DESCRIPTION

Figure 1:
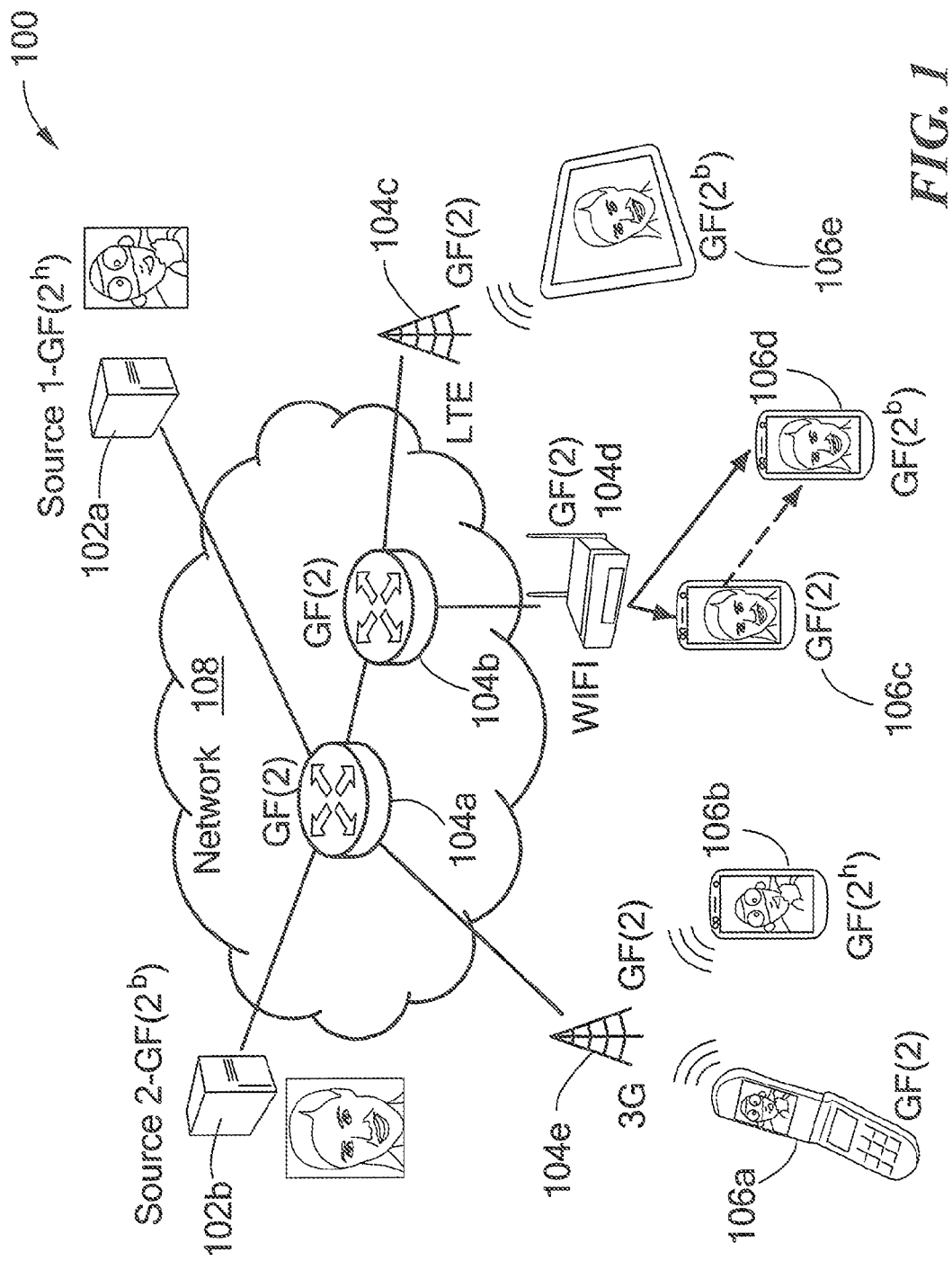
FIG. 1 is a network diagram of an exemplary network using Fulcrum network codes.

Before describing exemplary embodiments of the systems and methods used to teach the concepts, structures, and techniques sought to be protected herein, some introductory terminology used in conjunction with the exemplary embodiments are explained.

A "network" is made up of a plurality of processing sites generally referred to as "stations" or "nodes" connected by one or more physical and/or logical connections. When the connections enable transmission of a signal between the nodes, the connections are generally referred to as links. Links are sometimes unidirectional (i.e. transmission of a signal in one direction between the nodes) and sometimes are bidirectional (i.e. transmission of signals in both direction between the nodes).

Each node typically performs a switching function and one or more additional functions. The nodes may be coupled together in a variety of different network structures typically referred to as network topologies. For example, network nodes made be coupled in a so-called mesh topologies, ring (or circular) topologies, star topologies and tree topologies. Other topologies are also known.

The transmission of a signal from a first or source node to a second or receiver node may involve the transmission of the signal through one or more intermediate links and nodes coupled between the source node and the receiver node. Such a succession of links and nodes between a source node and a receiver node is referred to as a path.

As used herein, the term "wireline link" is used to describe a link between two nodes of a network that comprises any type of physical or hardwired connection. The term "wireless link" is used to describe a link that comprises any type of wireless connection (e.g. radio frequency (RF), cellular, wifi, point-to-point, mesh, and/or optical connection).

The terms "source" and "source node" are used herein to refer to a node in a network that transmits (or sends) packets (referred to as "source packets") to one or more other nodes via one or more links in the network. The term "intermediate node" is used herein to refer to a node in the network that both receives packets from one or more other nodes via one or more links in the network and sends packets to one or more additional nodes via one or more links in the network. The terms "sink, "sink node," "receiver," and "receiver node" are used herein to refer to a node in a network that receives packets through a link in the network. It should be understood that the framework described herein does not impose any limitations on the operation of particular nodes and, therefore, any node may function as a source, an intermediate node, and/or a receiver (notwithstanding any physical limitations of the network).

The terms "packet" and "symbol" are used herein to refer to any unit of data transmitted through a network. It should be understood that the concepts, structures, and techniques described herein are not limited to any particular packet/symbol sizes, data dimensions, or data formats. In some embodiments, a packet described herein comprises a User Datagram Protocol (UDP) packet and/or an Internet Protocol (IP) packet.

The term "field size" refers to the order of a finite field (sometimes referred to as a "Galois field"). The notation GF(n) refers to a finite field of size n. The notation $GF(2^k)$ refers to a finite field having a size which is a power of two, where k is any non-negative integer.

The term "recode" is used herein to refer to a process whereby a plurality of encoded data packets are combined to generate new coded packets. The term "re-encode" herein refers to a process whereby one or more data packets are decoded to recover the original information, and then the original information is encoded to generate new coded packets. Thus, re-encoding involves decoding whereas recoding does not.

Referring now to the figure FIG. 1, an exemplary network 100 is provided from a plurality of source nodes 102a, 102b (generally denoted 102), a plurality of intermediate nodes 104a-104e (generally denoted 104), and a plurality of receivers 106a-106d (generally denoted 106). The nodes 102, 104, 106 may be connected by a combination of wireline links, such as between nodes 102a and 104a, and/or wireless links, such as between nodes 104e and 106a. The sources 102 and receivers 106 are generally connected by a network 108, such as the Internet.

In operation, the sources 102 send data packets along paths to the receivers 106, by way of intermediate nodes 104. The sources may "precode" the packets using an "outer code," which is then mapped to an "inner code" supported within the network. Typically, in preferred embodiments, the outer code utilizes a field size which is higher (or greater than) than a field size utilized by the inner code. In other embodiments, the outer code utilizes a field size which is lower (or smaller than) than a field size utilized by the inner code The intermediate nodes 104 can recode using the inner code, the outer code, or a combination of the inner and outer codes. The inner and outer code field sizes may be selected based upon the capabilities of the source, the capabilities of the intermediate nodes, the capabilities of the receivers, and/or based upon desired network flow characteristics.

In the exemplary network 100, a first source 102a precodes in $GF(2^h)$ and a second source 102b precodes in $GF(2^b)$. The intermediate nodes 104 can recode using only GF(2) operations or may operate in higher fields. A receiver 106 may receive coded packets from one or more of the sources 102 and may decode in either the outer code (i.e. using $GF(2^h)$ or $GF(2^b)$ operations) or the inner code (i.e. using GF(2) operations). For example, the receivers 106a and 106c may choose to decode with GF(2) due to limited computation capabilities. In some embodiments, a node, such as a wireless router 104d, may be capable of decoding in a higher field, but may have to broadcast for a relatively long time due to bandwidth constrained receivers (e.g. 106c, 106d) and thus may choose to save energy on computation by accumulating additional packets and decoding using GF(2). A receiver, such as receiver 106c, can also recode data packets and send them to a neighbor (e.g. 106d) interested in the same content, thus increasing the coverage of the system and reducing the number of transmissions needed to deliver the content. Thus, it should be appreciated that any of the receiver nodes 106 in FIG. 1 may act as an intermediate node, and vice-versa.

It should be understood that the network shown in FIG. 1 is merely exemplary and that the concepts, structures, and techniques sought to be protected herein are not limited to any particular network topology and may be used generally with any number of source, intermediate, and receiver nodes, connected by any number and arrangement of wireline and/or wireless links.

As will be appreciated after reading the present disclosure, an advantage of Fulcrum codes is the ability to manage receivers with heterogeneous capabilities interested in the same flow, ideally guaranteeing a reasonable service to limited receivers while providing the performance advantages of higher field sizes to those that can afford the additional computational effort.

Although the structure and exemplary implementations of Fulcrum codes are fully described below in connection with FIGS. 3-5, a brief overview is given herein. Fulcrum codes use a dimension expansion procedure, which comprises taking a batch of n source packets, referred to as a "generation," and carrying out a conversion procedure into n+r coded packets in a high field, where r coded packets are expansion packets that contain redundant information. The source packets may be read from a file or a stream associated with a source node 102. After the expansion, each coded packet is then treated as a new packet that can be coded using an inner code supported within the network (e.g. GF(2), random linear network code (RLNC)) and sent through one or more links in the network. The outer code and/or inner code may be known at both sender nodes and at receiver nodes a priori. This may be accomplished, for example, using Reed-Solomon codes, or may be conveyed as a seed for a pseudo-random number generator (PRNG). In some embodiments, the outer code is agreed upon by the sources and receivers, while the inner code is generated in the network by recoding packets.

Since additions in any field of the type $GF(2^k)$ is simply a bit-by-bit XOR, the underlying linear mapping in higher fields can be reverted at the receivers. It should be understood that performing the expansion may be advantageous because coded packets have a higher probability of being linearly dependent when more data is available at the receiver, i.e., towards the end of the transmission. Increasing dimensions bypasses this problem by mapping back to the high field representation after receiving only n linearly independent coded packets and decoding before the probability of receiving independent combinations in GF(2) becomes prohibitive. Thus, as will be appreciated, the number of additional dimensions r (referred to herein as the "expansion size") controls throughput performance. In general, the larger the expansion size r, the higher the performance achieved by the receivers while still leveraging GF(2). Thus, Fulcrum network codes provide a flexible code structure with controllable throughput performance.

In some embodiments, the outer code structure is selected to accommodate heterogeneous receivers by using a systematic structure in the outer code. This provides the receivers with the alternative to decode in GF(2) after receiving n+r coded packets instead of mapping back to higher fields after receiving n coded packets. This results in less decoding complexity, as GF(2) requires simple operations, but incurring higher delay because r additional packets must be received.

Figure 2:
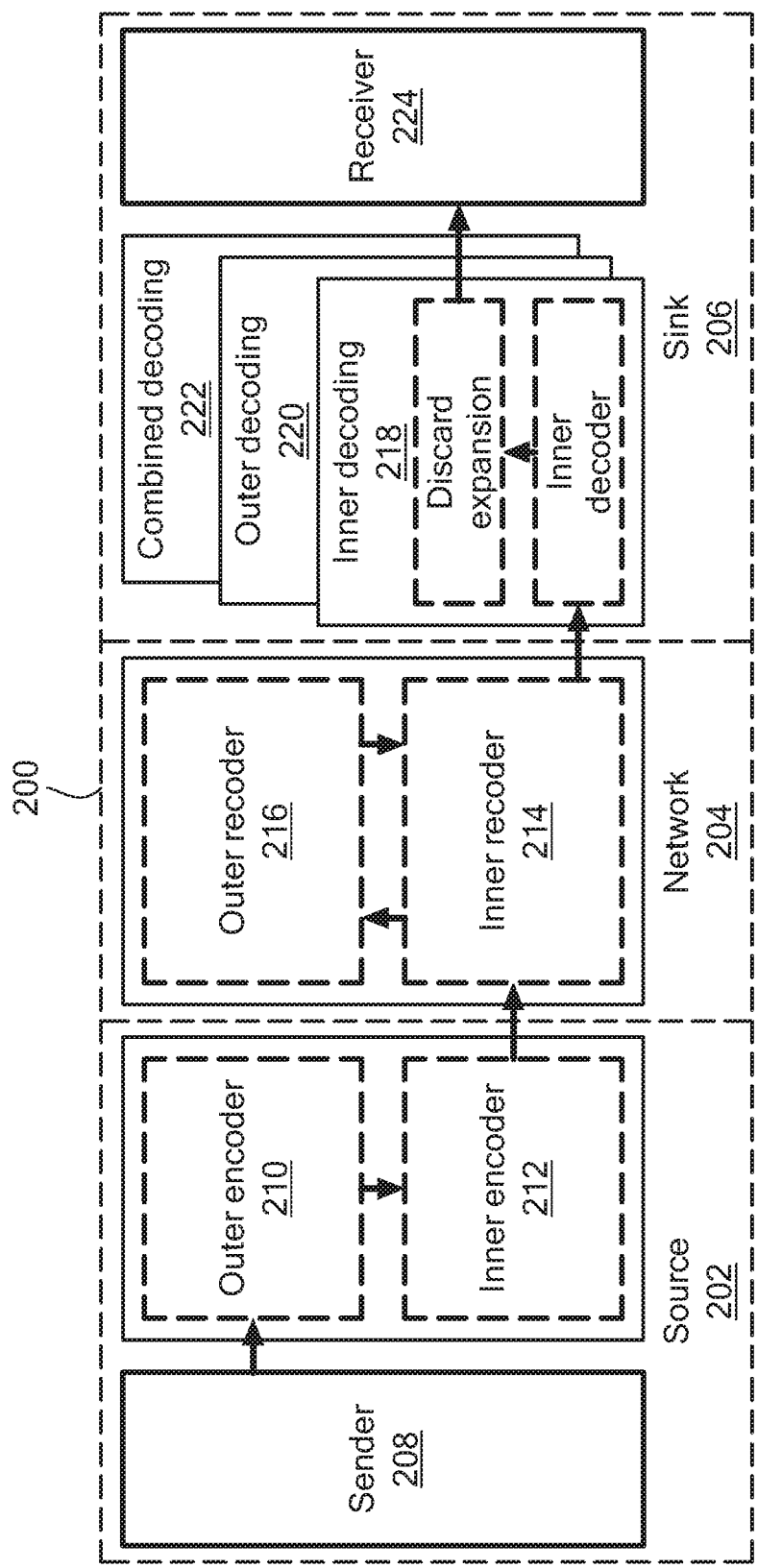
FIG. 2 is a block diagram showing inner and outer code structures within an exemplary network.

As will be appreciated, if the precoding uses a systematic structure, the system can support three main types of receivers: a receiver using outer decoding 220, a receiver using inner decoding 218, and a receiver using combined decoding 222 (FIG. 2). The outer decoding receiver 220, which may be a relatively more computationally powerful than the other receivers, decodes in GF($2^h$) by mapping back from the GF(2) combinations received. This procedure is relatively simple because the addition for any extension field GF($2^j$) is the same as that of GF(2), namely, a bit-by-bit XOR. The outer decoding receiver 220 can decode in the higher field after accumulating n linearly independent GF(2) coded packets. The inner decoding receiver 218 decodes in GF(2) to reduce decoding complexity but requires more time to gather n+r independent linear combinations. Wherein a systematic precoding structure is used, decoding in GF(2) is sufficient to decode the source packets without additional operations. In exemplary embodiments, the combined decoding receiver 222 can achieve a decoding probability when receiving n coded packets similar to the outer decoding receiver 220, while having similar decoding complexity to that of the inner decoding receiver 218.

In some embodiments, the network 100 uses an RLNC outer code operating in GF($2^8$) or GF($2^{16}$), and an RLNC inner code operating GF(2). It will be appreciated that the concepts, structures, and techniques described herein is compatible with any end-to-end linear erasure code in GF($2^h$).

Referring now to FIG. 2, a block diagram 200 is used herein to describe an exemplary network coding framework. A source node 202 may correspond to any of the sources 102 in FIG. 1, an intermediate network node 204 may correspond to any over the intermediate nodes 106 in FIG. 1, and a receiver node 206 may correspond to any over the receivers 106 in FIG. 1. Although FIG. 2 shows one intermediate node 204, it will be appreciated that, in general, a source node and a receiver node may be connected via an arbitrary number of intermediate nodes (i.e. block 204 may represent a network with an arbitrary topology).

The source 202 comprises a sender 208, an outer encoder 210, and an inner encoder 212. In general operation, the sender 208 provides packets (referred to herein as "source packets") to the encoders 210, 212, and in turn, the encoders encode the source packets to generate coded packets for transmission in the network 204.

In an exemplary embodiment, the sender 208 provides n source packets, $P_1, P_2, \ldots, P_n$, and the outer encoder 210 generates n+r outer-coded packets, $C_1, C_2, \ldots, C_{n+r}$ using GF($2^h$) operations (where r is understood to be the expansion size). In some embodiments, the sender 208 is an application physically and/or logically collocated with the outer encoders 210. In other embodiments, the sender 208 is physically/logically separate from the outer encoders 210. The details for generating the initial encoding in GF($2^h$) are described below in connection with FIG. 3.

The source 202 re-labels the outer-coded packets as mapped packets to be sent through the network and assigns them binary coefficients in preparation for the GF(2) operations to be carried in the network. The inner encoder 212 may encode the re-labeled packets as inner-coded packets using GF(2), although in some embodiments some of the re-labeled packets can be sent directly into the network. In general, the i-th inner-coded packet has the form $\Sigma_{j=1}^{n+r} \lambda_{i,j} C_j$ (where $\lambda$ is understood to be matrix of linear coefficients selected from the outer code field). The coding in GF(2) can be performed in accordance with the network's supported inner code. For example, if the network supports GF(2) RLNC, the source can generate RLNC coded packets. It will be appreciated that other inner codes, e.g. perpetual and tunable sparse network coding, are also supported by the framework described herein. In some embodiments, an encoding vector is distributed together with each coded symbol/packet to allow recoding. The encoding vector may be compressed to reduce transmission overhead.

In some embodiments, the outer encoder 210 is implemented separate from the inner decoder 212, where the outer encoder uses n source symbols to produce n+r coded symbols which are provided as input to the inner encoder.

The exemplary intermediate node 204 comprises an inner recoder 214 and an outer recoder 216. In some embodiments, an intermediate node 204 comprises an inner recoder but not an outer recoder. In other embodiments, an intermediate node 204 does not comprise a recoder.

In operation, the intermediate nodes 204 receive coded packets in GF(2) of the form $\Sigma_{j=1}^{n+r} \lambda_{i,j} C_j$, store them in their buffers, and send recoded versions into the network, typically implementing an inner recoder. It should be understood that the recoding mechanism generally defines the structure of the network's inner code. Recoding can be done as a standard GF(2) RLNC system would do, i.e., each packet in the buffer has a probability of ½ to be XORed with the others to generate the recoded packet. However, the network can also support other recoding mechanisms, such as recoding for tunable sparse network coding, for Perpetual network codes, or even no recoding. In some embodiments, an updated encoding vector is distributed together with each coded symbol/packet to allow additional recoding.

In some embodiments, the intermediate node 204 includes an outer recoder 216 configured to exploit the outer code in the network. Such recoders may primarily operate using GF(2). However, when the intermediate node gathers n linearly independent coded packets in the inner code, it may choose to map back to the higher field in order to decode the data and improve the quality (e.g. completeness and linear independence) of the recoded packets. The rationale is that, at that point, it can recreate the original code structure and generate the additional dimensions r that are missing in the inner code, thus speeding up the transmission process. Although not required for the operation of the system, this mechanism can be quite useful if the network's intermediate nodes are allowed to trade-off throughput performance with complexity.

The receiver 206 represents three exemplary types of receivers: an inner decoding receiver 218 (i.e. a receiver that uses inner decoding), an outer decoding receiver 220 (i.e. a receiver that uses outer decoding), and a combined decoding receiver 222, as shown. As will be appreciated, such heterogeneous receivers are generally supported if the sources 202 precode using a systematic mapping structure. Other precoding approaches can be used enabling different end-to-end capabilities and requirements.

In operation, the outer decoding receiver 220 maps back to the original linear combination in GF($2^h$). This means that only decoding of an n×n matrix in the original field is required and thus the receiver 220 can decode after receiving n independent coded packets in GF(2) with high probability. In general, the receivers need to know the mapping in GF($2^h$) to map back using the options described for the source. These receivers typically use more complex operations for decoding packets, but may operate with less delay than GF(2) to recover the necessary linear combinations to decode.

The inner decoding receiver 218 decodes using GF(2) operations for the n+r relabelled packets. This is typically a faster, less expensive decoding mechanism relative to the mechanism used in decoder 220, although there is some additional cost of decoding a (n+r)×(n+r) matrix. If the original mapping uses a systematic structure, decoding in this form already provides the source packets without additional decoding in GF($2^h$). Although reduced computational effort is required, additional delay may be incurred by having to wait for n+r independent linear combinations in GF(2). It will be appreciated that the inner decoder 218 is compatible with networks using GF(2) coding operations.

The combined decoding receiver 220 implements a hybrid between inner and outer decoders. Exemplary outer, inner, and combined decoder implementations are described more fully below in connection with FIGS. 5-5C.

In some embodiments, a receiver supports multiple types of decoders (e.g. inner and outer) and selects a suitable decoder using a strategy to reduced decoding effort and/or reception time. For example, in the case of a single hop broadcast network, a device that has the best channel of the receivers could choose to wait for additional transmissions from the source, given that those transmissions will happen in any case and the receiver might still invest energy to receive them (e.g., to wait for the next generation). The additional receptions can be used to decode using GF(2) instead of doing the mapping to decode in GF($2^h$) in this way reducing the energy invested in decoding. On the other hand, a receiver with a relatively low throughput and/or high latency channel can attempt to use GF($2^h$) to decode in order to reduce its overall reception time.

In some embodiments, a source node 202 and/or intermediate node 204 can tune the outer code expansion size r and inner code density d to achieve desired complexity-throughput tradeoff. For example, to achieve the performance of a binary RLNC code, the network can use an outer code having no expansion (i.e. r=0) and an inner code having density $$d \approx \frac{n}{2}$$

(where n is the generation size). To achieve a sparser binary RLNC code, the network can use r=0 and $$d \ll \frac{n}{2}.$$

To achieve performance similar to a an RLNC code with a high field size, the network can use r>>n and d=1. Thus, it should be appreciated that the coding framework described herein can be configured to cover a wide range of decoding complexity versus throughput performance tradeoffs. Importantly, these parameters can also be changed on-the-fly without any coordination between the encoder to the decoder, allowing for adoption to time varying conditions.

In some embodiments, a source node 202 and/or intermediate node 204 can achieve desired end-to-end performance through the choice of outer code. For example, Reed-Solomon, systematic RLNC, non-systematic RLNC, or other Maximum Distance Separable (MDS) codes (both standard and systematic) can be used.

In some embodiments, a source 202 and a receiver 206 are configured to use the outer code for secure, end-to-end communication. For example, the outer code may a shared secret between the source 202 and receiver 206 (i.e. the code is not sent over the network along with the coded packets). In some embodiments, the source 202 and receiver 206 use a non-systematic outer code with a very large field size to provide increased data confidentiality.

Figure 3:
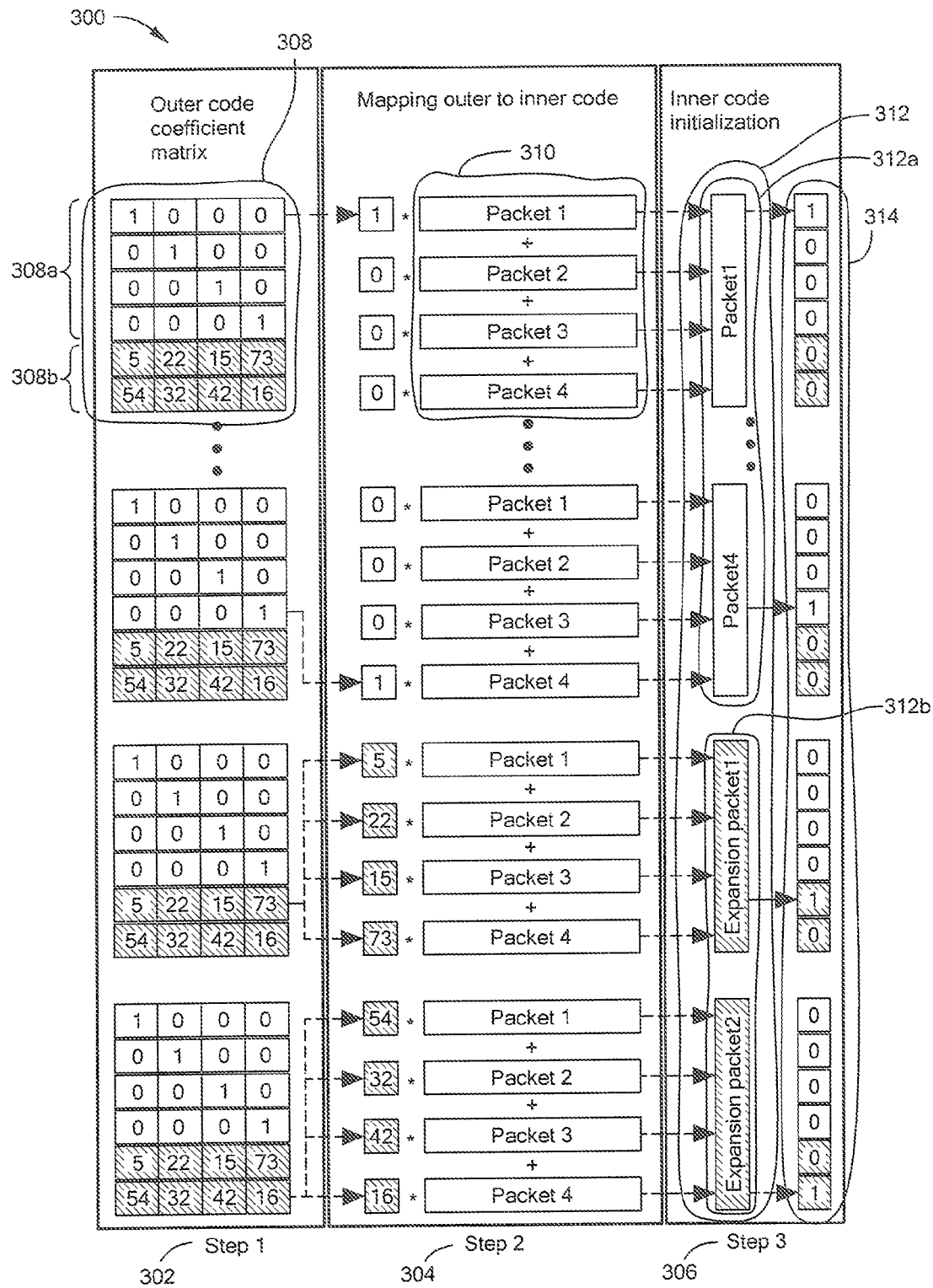
FIG. 3 is a sequence diagram showing an exemplary encoder using a systematic outer code.

Referring now to FIG. 3, an exemplary encoder implementation 300, which operates in GF(2), is shown. The implementation 300 uses a generation size n=4 and an expansion size r=2, although it will be appreciated these sizes are selected merely for illustrative purposes. The encoder implementation 300 may be used, for example, within a source nodes and/or intermediate nodes. Within FIG. 3, elements shown without hatching (e.g. element 308*a*) generally correspond to source symbols, whereas values elements with left-to-right hatching (e.g. element 308*b*) generally correspond to outer code expansion symbols.

As illustrated in FIG. 3, an operation of an exemplary encoder implementation 300 comprises three parts. In a first part of the operation 302, an outer coding matrix 308 is initialized. The outer coding matrix 308 comprises coefficients used to linearly transform source symbols and may be shared by sources 202 and receivers 206 (FIG. 2). In some embodiments, the matrix 308 is also shared with intermediate nodes 204 having an outer recoder 216 (FIG. 2). The outer coding matrix 308 comprises a first sub-matrix 308*a* and a second sub-matrix 308*b*. In this example, the first sub-matrix 308*a* is an identity matrix used to map the n source symbols directly to the inner code, whereas the second sub-matrix 308*b* defines the outer code. Thus, it will be appreciated that the exemplary implementation 300 utilizes a systematic outer code. The criteria for selecting the outer code coefficients 308*b* is to allow decoding when receiving n+r coded packets and, preferably, to allow decoding with a high probability after receiving n coded packets. Thus, any scheme can be used to generate the coefficient values (e.g. MDS codes such as Reed-Solomon, or even random values), so long these criteria are met.

In a second part of the operation 304, the outer coding matrix 308 is used to generate n+r outer-coded packets 312 from the n source packets 310. In some embodiments, the n+r outer-coded packets 312 are a linear combination of the n source packets 310. Because the implementation 300 uses a systematic outer code, the first to n coded packets 312*a* are simply the n source packets. The other r coded packets 312*b* are expansion packets.

In a third part of the operation 306, the n+r outer-coded packets 212 are mapped to the inner code by assigning coefficients 314. Wherein a network supports GF(2) coding, the coefficients 314 are binary, as shown. Finally, the mapped packets can be encoded using the inner code and sent into the network. In some embodiments, some of the mapped packets can be sent into the network without inner encoding.

FIGS. 4A-4D show four exemplary encoder implementations. Each of these examples are based on an outer code having a generation size n=8 and an expansion size r=2. However, it should be understood that the concepts, structures, and techniques described herein are not limited to any specific generation size or expansion size. It should further be understood that, within the exemplary implementations of FIGS. 4-4D, the values t1, t2, . . . , tn represent time values in increasing order. Time values on the left side of each figure (i.e. the columns labeled "Symbol available") represent a time at which one or more source symbols are available for encoding. Time values on the right side of each figure (i.e. the columns labeled "Symbol sent") represent a time at which one or more coded symbol may be sent through a network.

Figures 4A, 4B:
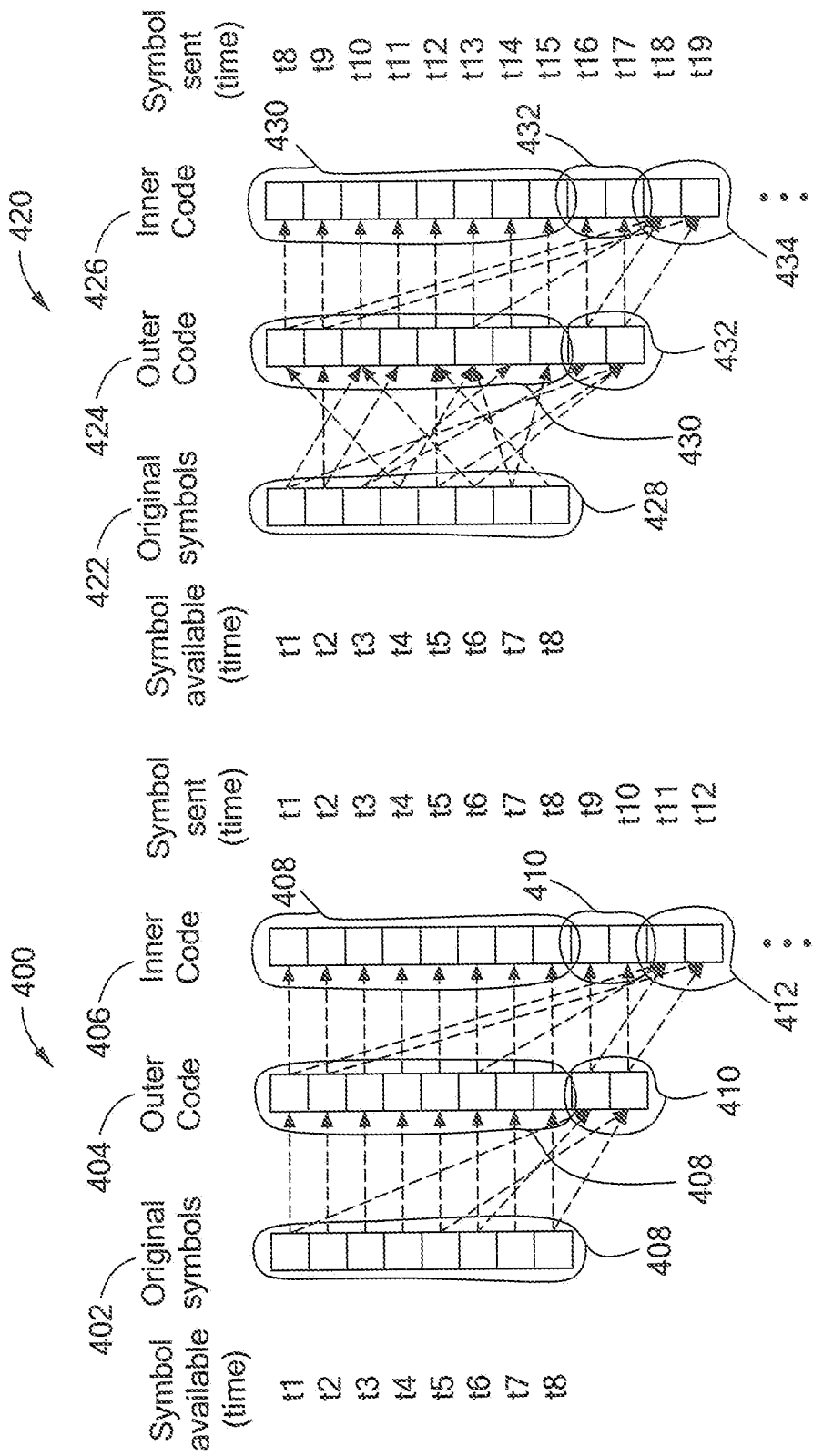
FIG. 4A is a sequence diagram showing an exemplary encoder using a systematic outer code and a systematic inner code.
FIG. 4B is a sequence diagram showing an exemplary encoder using a non-systematic outer code and a systematic inner code.

FIG. 4A shows an exemplary encoder implementation 400 using a systematic outer code and a systematic inner code. The implementation 400 comprises three stages. In a first stage 402, n source symbols 408 are directly mapped to both the outer code and an inner code. In a second stage 404, the outer encoder generates r expansion symbols 410 which are directly mapped to the inner code. In a third stage 406, the inner encoder is fully initialized and may begin generating encoded symbols 412 according to the network's inner code.

The source symbols 408 are provided over eight time intervals t1, t2, . . . , t8, with one new symbol available at each interval. Because the outer code is a systematic code, as each source symbol 408 becomes available, it can be directly mapped to a corresponding outer-coded symbol (stage 404). When an entire generation n=8 of source symbols is available (e.g. at time t8), expansion symbols 410 can be generated using the outer code. In some embodiments, the expansion symbols 410 are a linear combination of the source symbols 402. Because the inner code is also a systematic code, the source symbols 408 and the expansion symbols 410 can be directly mapped to inner-coded symbols shown in stage 406.

In some embodiments, the implementation 400 waits for a full generation of source symbols to be available before any encoding could take place. However, this is not necessary in cases where both encoders support systematic encoding. In such cases, it is possible to forward the n source symbols directly through both encoders without doing any coding operations or adding additional delay, as shown in FIG. 11.

As both encoders in implementation 400 are systematic, no coding takes place until times t9 and t10, where the outer encoder produces the first encoded symbols. At this point, the inner encoder is still in the systematic phase and therefore may pass the two symbols directly through to the network. In time t11, the inner encoder exits the systematic phase and starts to produce encoded symbols 412. At this stage, the inner encoder is fully initialized and no additional symbols are needed from the outer encoder; therefore, all subsequent encoding operations take place in the inner encoder.

It will be appreciated that the exemplary implementation 400, using a systematic structure, can be beneficial for low delay applications because packets can be sent as they arrive at the encoder. However, it should be understood that systematic encoding is not always required for attaining low delay. For example, the exemplary encoder implementation of FIG. 4C (discussed below in connection therewith) shows that low delay can also be achieved even in cases where both encoders do not operate in a systematic mode.

FIG. 4B shows an exemplary "semi-systematic" encoder implementation 420 using a non-systematic outer code and a systematic inner code. In a first stage 422, source symbols 428 are mapped to the non-systematic outer code as mapped symbols 430, which may be a linear combination of the source symbols. In second stage 424, the outer encoder generates r expansion symbols 432 which are directly mapped to the inner code along with the n mapped symbols 430, as shown. In a third stage 426, the inner encoder, which is fully initialized, encodes the n+r symbols (i.e. the n mapped symbols 430 and the r expansion symbols 432) to generate encoded symbols 434. The outer-coded symbols can be sent through the network starting at time t8, the expansion symbols 432 starting at time t16, and the inner-coded symbols 434 starting at time t18. Using a semi-systematic structure allows a simple de-mapping process in some topologies (e.g., single hop, or transmissions over a few hops), which reduces the complexity needed for decoding using the outer code.

Figures 4C, 4D:
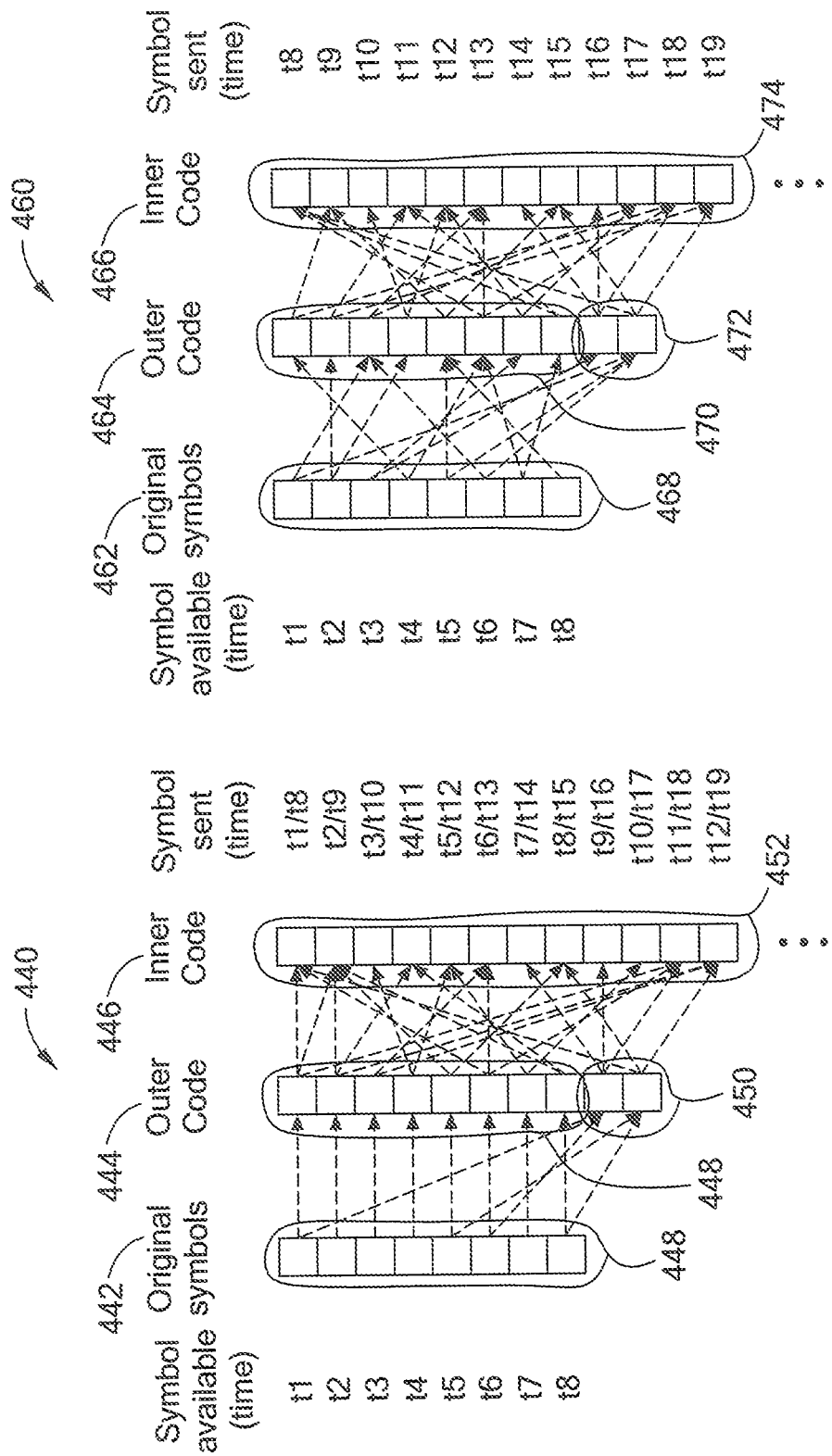
FIG. 4C is a sequence diagram showing an exemplary encoder using a systematic outer code and a non-systematic inner code.
FIG. 4D is a sequence diagram showing an exemplary encoder using a non-systematic outer code and a non-systematic inner code.

FIG. 4C shows an exemplary semi-systematic encoder implementation 440 using a systematic outer code and a non-systematic inner code. In a first stage 442, source symbols 448 are mapped directly to an outer code. In a second stage 444, the outer encoder generates r expansion symbols 450 after all source symbols 442 are available. In a third stage 446, the inner encoder, which is fully initialized, encodes the n+r symbols (i.e. the n source symbols 448 and the r expansion symbols 450) to generate inner-encoded symbols 452.

Implementation 440 can be used in networks where multiple sources for the same data exist or where the state of the receivers is unknown. Depending on the structure of the inner encoder, low delay can be achieved using implementation 440. In some embodiments, the inner encoder could be an RLNC encoder generating non-zero coefficients for the available symbols (i.e., using an on-the-fly encoding mechanism), which can reduce delay. In FIG. 4C, the leftmost times within the "Symbol sent" column correspond to this embodiment. In another embodiment, the system waits for all packets to be received before encoding with the inner encoder. In FIG. 4C, the rightmost times within the "Symbol sent" column correspond to this alternate embodiment.

FIG. 4D shows an exemplary fully non-systematic encoder implementation 460. In a first stage 462, source symbols 468 are mapped to the outer code as mapped symbols 470, which may be a linear combination of the source symbols. In a second stage 464, the outer code generates r expansion symbols 472. In a third stage 466, the inner encoder, which is fully initialized, encodes the n+r symbols (i.e. the n mapped symbols 470 and the r expansion symbols 472) to generate inner-encoded symbols 474. In some embodiments, the inner encoder uses RLNC. No symbols can be sent through the network until time t8.

It should that appreciated that structure used within implementation 460 combines the benefits discussed above with implementations 420 and 440, at the cost of increased delay. In some embodiments, implementation 460 may be selected to minimize the risk of transmitting linear dependent information in networks which may contain multiple sources for the same data, e.g. in Peer-to-Peer systems, or if the state of the receivers are unknown.

It should be appreciated that the exemplary implementations shown in FIGS. 4B and 4D allow for security to be provided seamlessly by basing the outer code on secret information (i.e. a shared secret).

Figure 5:
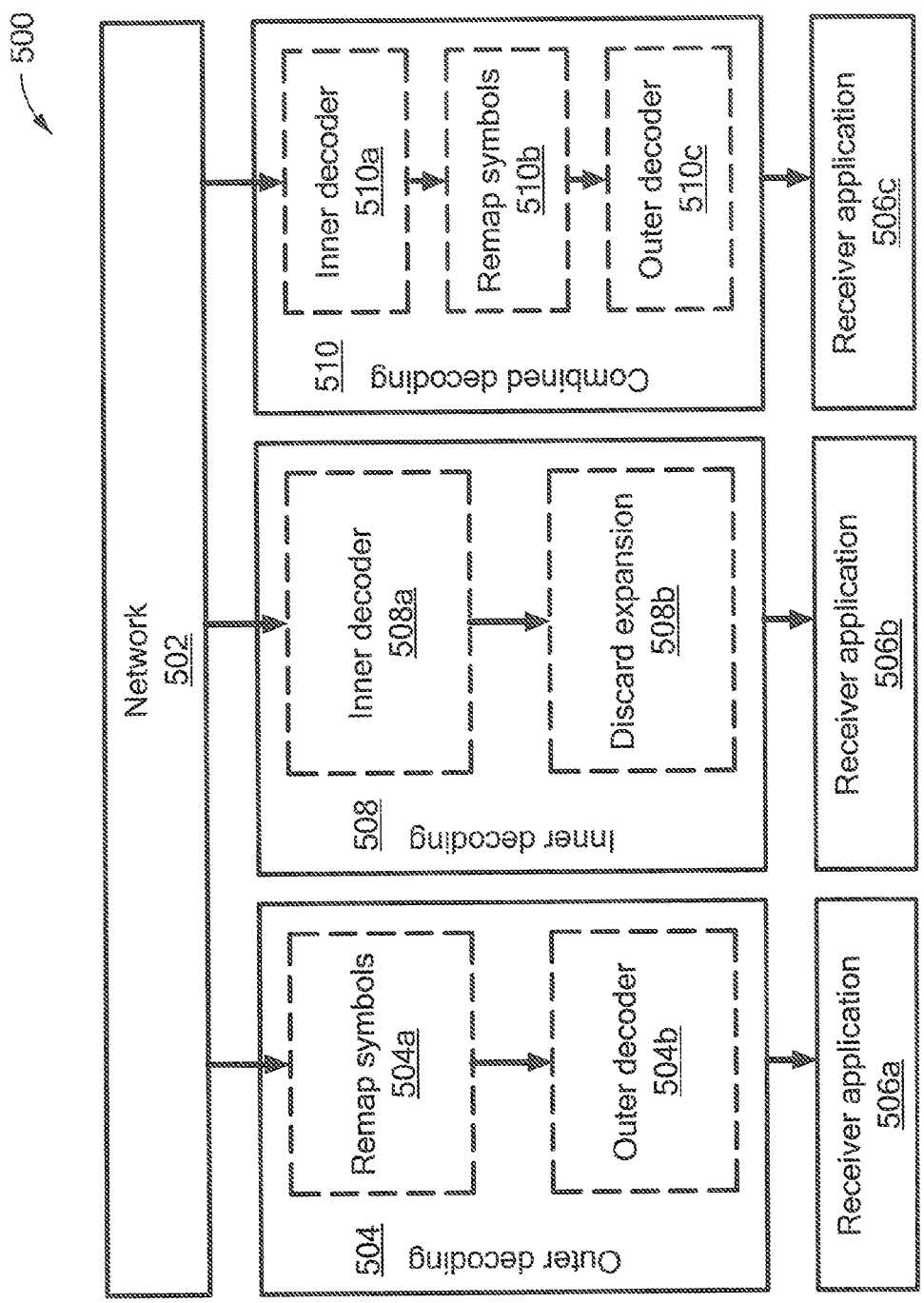
FIG. 5 is an overview diagram showing three types of Fulcrum decoders.

FIG. 5 is a high-level block diagram of three exemplary decoders: an outer decoder 504, an inner decoder 508, and a combined decoder 510. The decoders 504-508 are provided to reverse the mapping created within a Fulcrum encoder, such as any of the encoders shown in FIGS. 4A-4D, to recover source packets/symbols. Each of the decoders 504-508 may operate on the same data stream coming from a network 502 and the output of each decoder can be provided to one or more receivers 506a-506c, as shown.

Figure 5A:
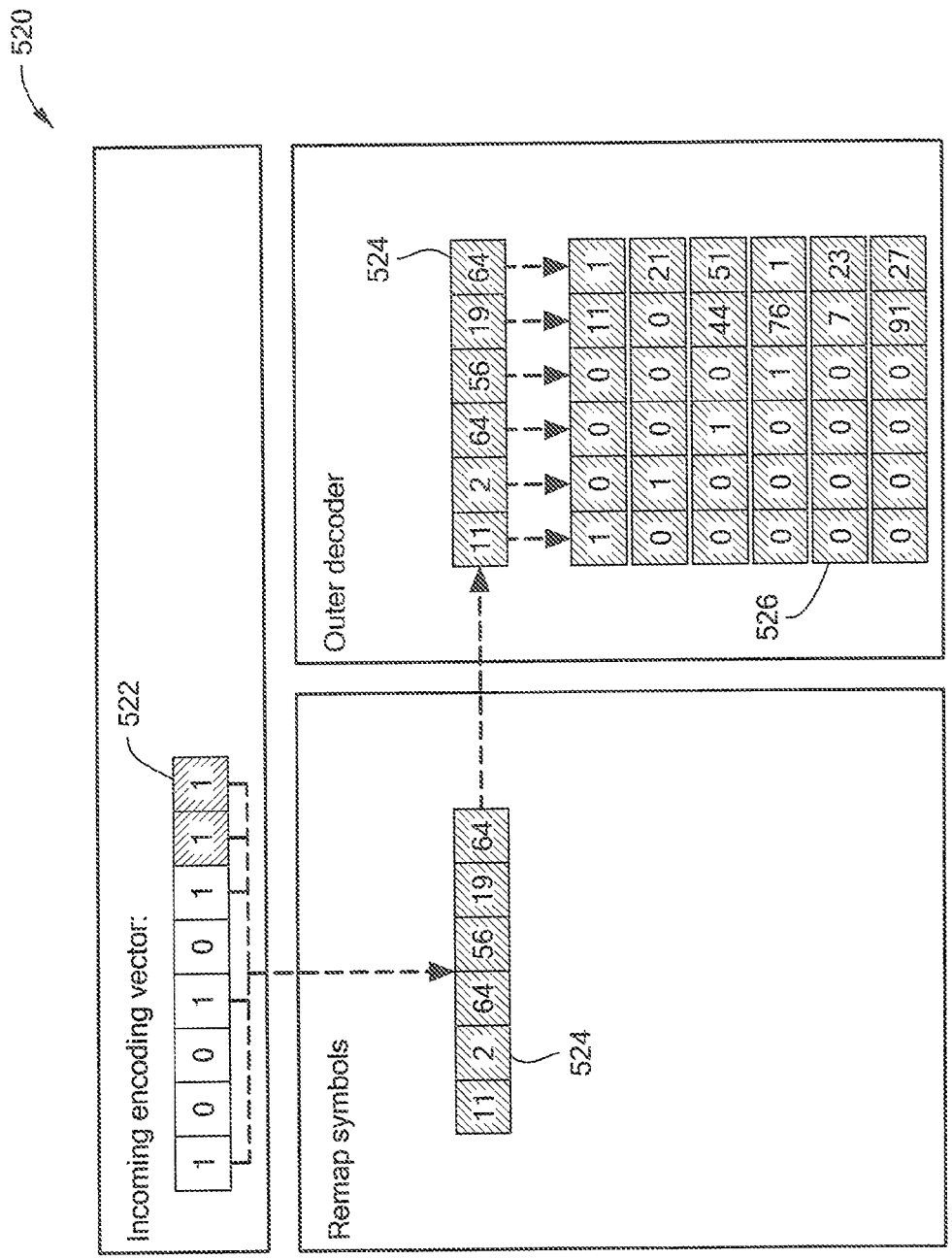
FIG. 5A is a sequence diagram showing an exemplary outer decoder.
Figure 5B:
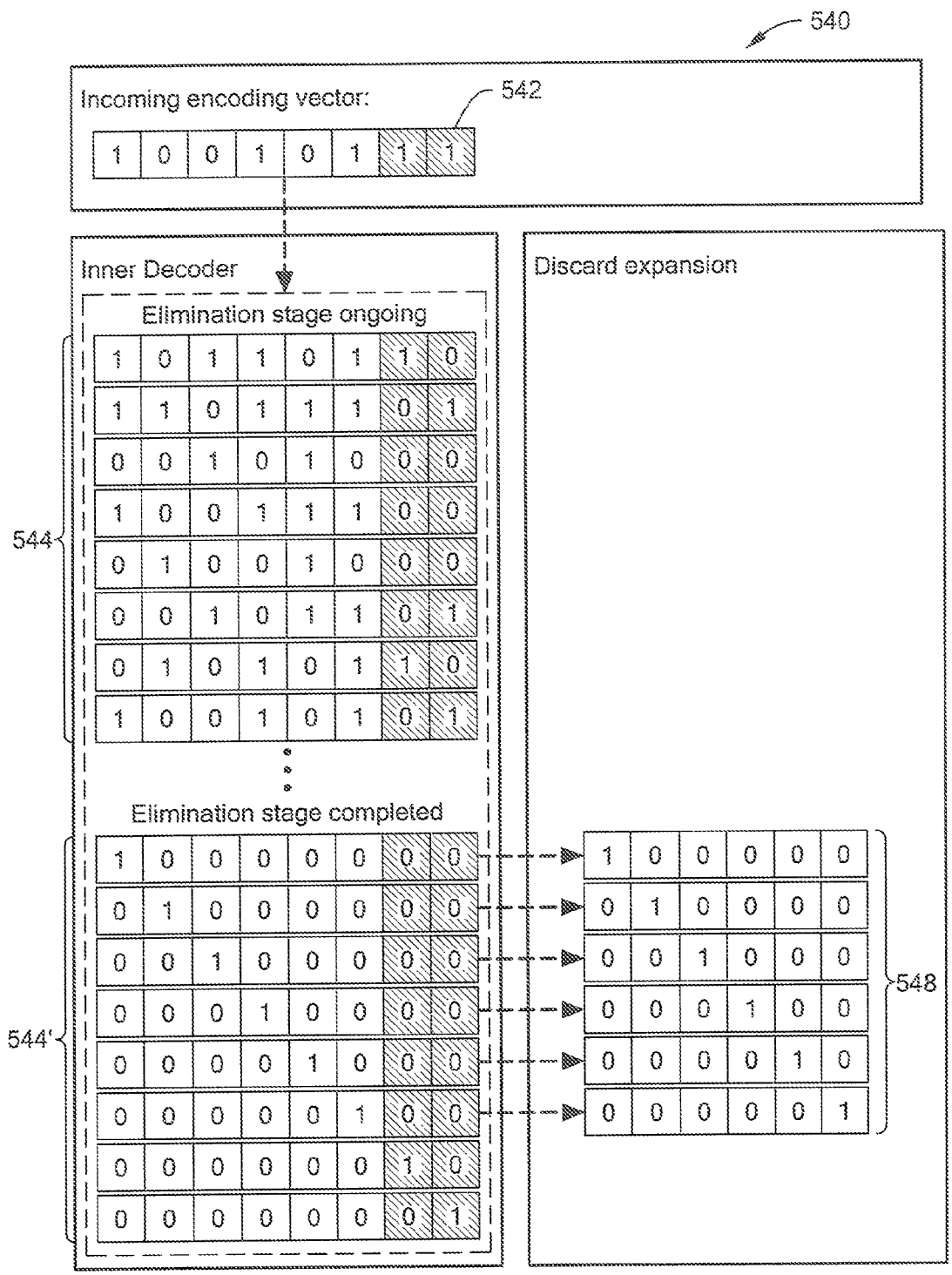
FIG. 5B is a sequence diagram showing an exemplary inner decoder.
Figure 5C:
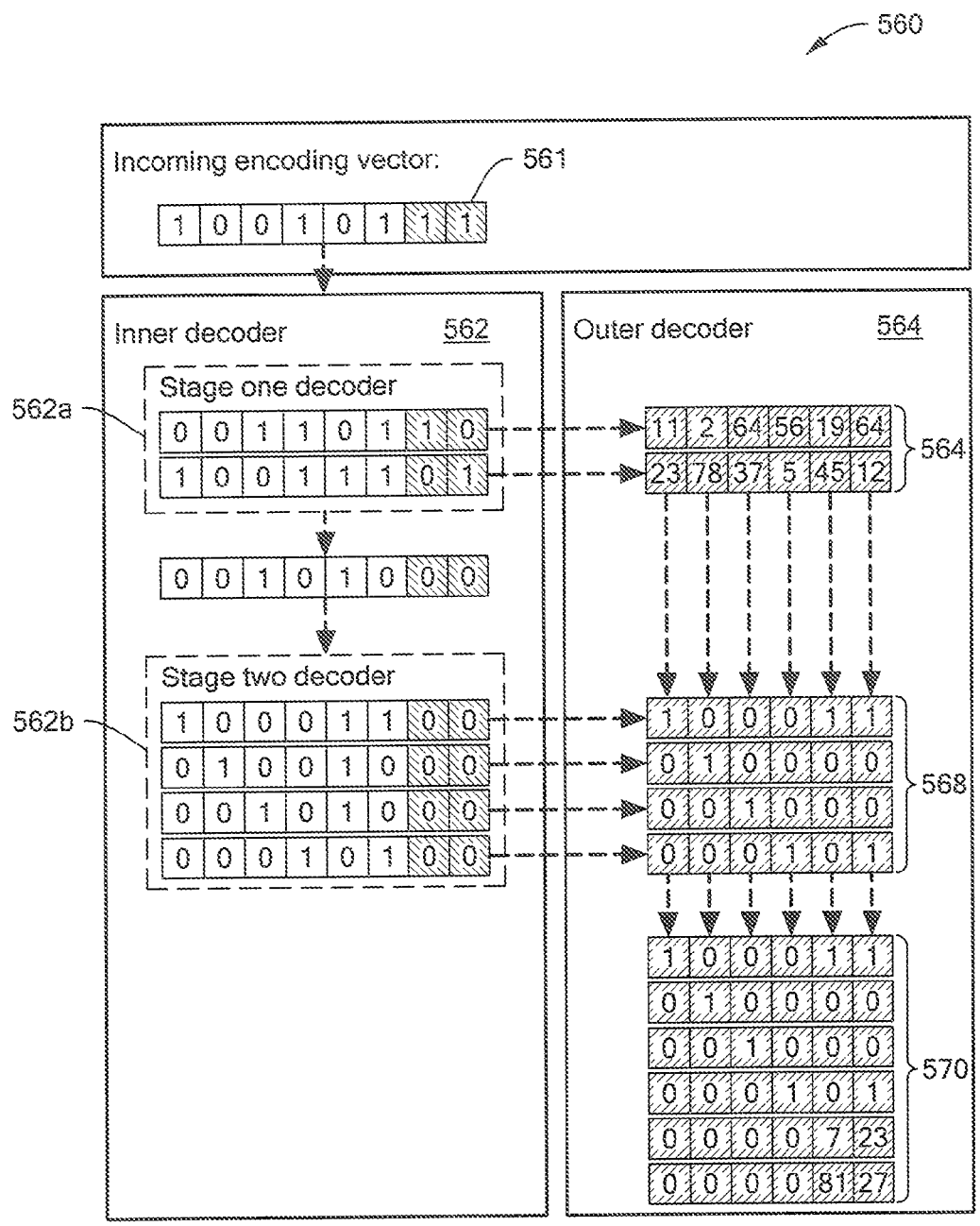
FIG. 5C is a sequence diagram showing an exemplary combined decoder.

Heterogeneous receivers can be supported using a mix of the three decoding types, depending on receiver capabilities. For example, a first receiver 506a, which utilizes the outer decoder 504, may have greater processing capabilities and/or a worse channel compared to the other receivers 506b, 506c. An exemplary outer decoder implementation, inner decoder implementation, and combined decoder implementation are shown in FIGS. 5A, 5B, and 5C, respectively, and described below in connection therewith. Within the several FIGS. 5A-5C, elements shown without hatching (e.g., element 548 in FIG. 5B) generally correspond to symbols from the original source, elements shown with left-to-right hatching generally correspond to symbols from the outer code expansion, and elements shown with right-to-left hatching (e.g., element 524 in FIG. 5A) generally correspond to symbols mapped to the outer code.

FIG. 5A shows an exemplary outer decoder implementation 520. Inner-coded packets (not shown) are received from the network and corresponding encoding vectors 522 are determined. In some embodiments, the encoding vector 522 may be sent through the network (e.g. along with the received data packets). In other embodiments, the encoding vector 522 can be derived using a PRNG seed associated with the coded packet.

In a first stage, which may be implemented within a component 504a of FIG. 5, the received coded packets are mapped from the inner code to the outer code using a lookup table to produce remapped symbols 524. The lookup table generally consists of the encoding vectors used in the outer code to generate the outer coded packets, including the expansion packets. The lookup table is generally known at the source and the receiver. In general, the size of the lookup table depends on the whether the outer encoder is systematic or not. In the case of a systematic outer encoder, a lookup table of size r is sufficient, since the initial n symbols were not encoded (i.e. using a unit vector), where it is understood that n and r represent the generation size and expansion size, respectively. In the case of a non-systematic outer encoder, all n+r encoding vectors must be stored. In some embodiments, the lookup table may be pre-computed and thus no additional processing is required during decoding. For example, pre-computing the lookup table is possible by making the table dependent on the incoming coding coefficients.

In a second stage, which may be implemented within a component 504b of FIG. 5, the mapped symbols 524 are decoded using the outer code in $GF(2^h)$ to recover original source symbols. In some embodiments, the outer code is linear and uses a coefficient matrix 526, as shown. In general, each row in the matrix 526 is a linear combination of rows in the coefficient matrix (e.g. coefficient matrix 308 in FIG. 3). It should be appreciated that the exemplary outer decoder implementation 520 can recover the source data packets with a high probability after receiver only n packets, using $GF(2^h)$ operations.

FIG. 5B shows an exemplary inner decoder implementation 540. Inner-coded packets (not shown) are received from the network and corresponding encoding vectors 542 are determined, as discussed above in connection with FIG. 5A.

In a first stage, which may be implemented within a component 508a of FIG. 5, received packets are collected and corresponding encoding vectors are added to an elimination matrix 544. After n+r linearly independent packets are collected, the elimination matrix 544' can be used to recover the n original source packets and the r expansion packets by solving the linear system. In some embodiments, the inner decoder uses RLNC GF(2). In other embodiments, where sparse inner codes are used, other decoding algorithms could be used, e.g., belief propagation as in LT and Raptor codes.

In a second stage, which may be implemented within a component 508b of FIG. 5, the original source packets are recovered by discarding all symbols belonging to the outer expansion. Thus, the inner decoder implementation 540 can recover the source data packets using only GF(2) operations after receiving n+r packets. It should be noted that the implementation 540 is generally only compatible with a systematic outer encoder.

FIG. 5C shows an exemplary combined decoder implementation 560. In a first stage, when an encoding vector 561 arrives at a combined decoder, it is first passed to the inner decoder 562. Internally, the inner decoder is split into two stages. In a stage one decoder 562a, the extension added in the outer encoder is eliminated (i.e. the symbols that when mapped to the outer decoder will have coding coefficients from the outer field). If the stage one decoder 562a successfully eliminates the expansion, the symbol is passed to a stage two decoder 562b, wherein linear combinations of the source symbols are stored.

Once the stage one decoder 562a and the stage two decoder 562b combined have full rank, the stored symbols are mapped to the outer decoder 564. As shown, symbols 568 coming from the stage two decoder have coding coefficients 0 and 1 and require only a few operations to be decoded, whereas the symbols 566 coming from the stage one decoder have a dense structure with coding coefficients coming from the outer field, represented by $c_{xy} \in GF(2^h)$, where $GF(2^h)$ is the field used for the outer code. After mapping to the outer decoder, the final step is to solve the linear system 570. Thus, it will be appreciated that the combined decoder implementation 560 ideally decodes as much as possible using the inner decoder before switching to the typically more computationally costly outer decoder. In general, this decoder is advantageous only if the outer encoder is systematic or, potentially, very sparse.

It should be appreciated that the inner decoder 562 and outer decoder 564 may implemented within one or more components, such as components 510a-510c of FIG. 5.

Figure 6:
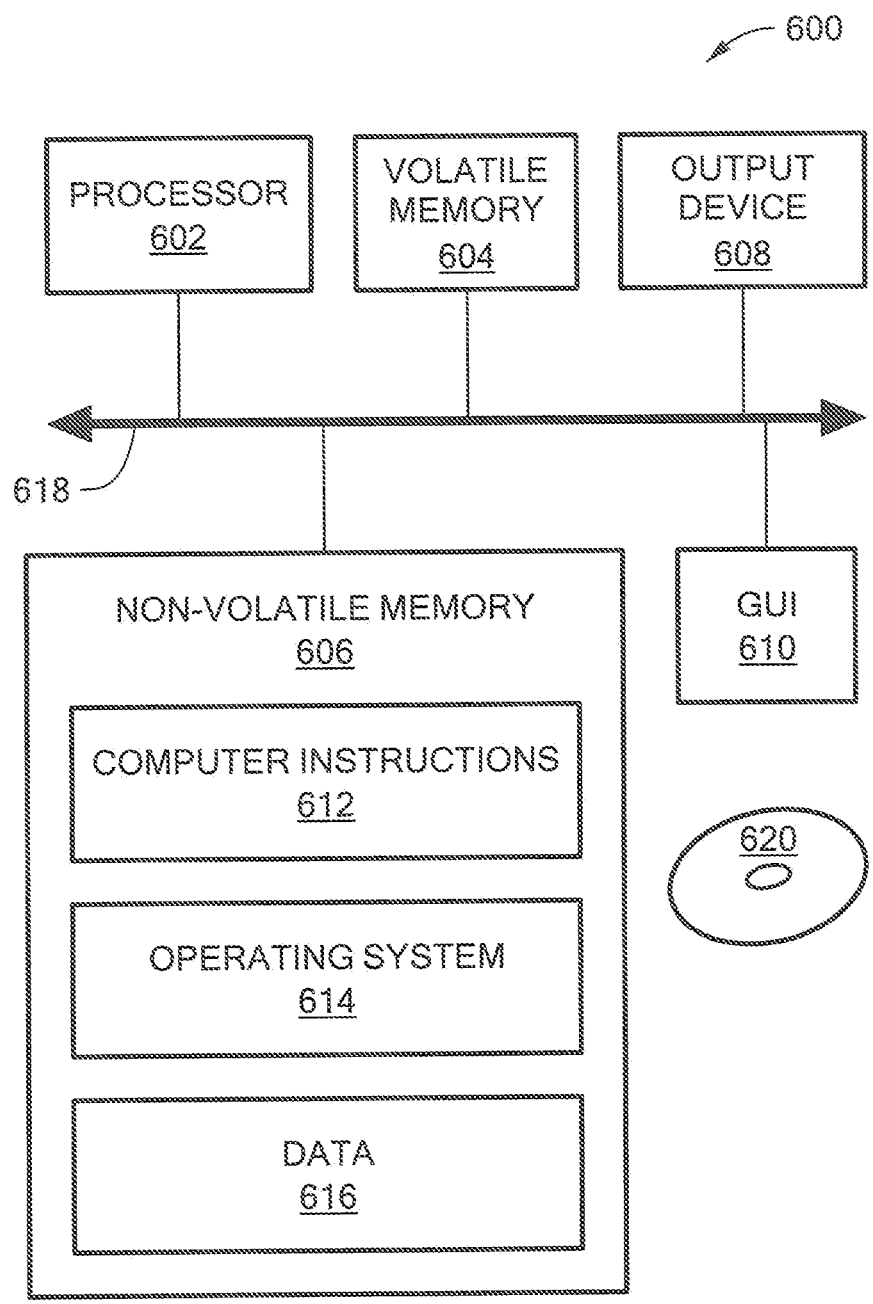
FIG. 6 is a schematic representation of an exemplary computer that can form a part of the systems of FIGS. 1-5.

FIG. 6 shows an exemplary computer 600 that can perform at least part of the processing described herein. The computer 600 includes a processor 602, a volatile memory 604, a non-volatile memory 606 (e.g., hard disk), an output device 608 and a graphical user interface (GUI) 610 (e.g., a mouse, a keyboard, a display, for example), each of which is coupled together by a bus 618. The non-volatile memory 606 stores computer instructions 612, an operating system 614, and data 616. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

All references cited herein are hereby incorporated herein by reference in their entirety.

Having described exemplary embodiments, which serve to illustrate various concepts, structures, and techniques sought to be protected herein, it will now become apparent to those of ordinary skill in the art that other embodiments incorporating these concepts, structures, and techniques may be used. Accordingly, it is submitted that that scope of the patent should not be limited to the described embodiments but rather should be limited only by the spirit and scope of the following claims.

Moreover, those skilled in the art will understand that the concepts, structures, and techniques sought to be protected herein are applicable to a wide range of systems, networks, and applications. By way of non-limiting examples, Fulcrum codes can be used within wireless networks, wireline networks, and mesh networks; and for multicast and peer-to-peer applications. It will be appreciated that Fulcrum is beneficial for multicast (i.e. point to multipoint) in wireless networks, particularly with heterogeneous receivers, because Fulcrum will allow each receiver to select its level of effort for decoding. Fulcrum is also beneficial within wireline networks because the servers/switches/routers in the backbone need to process huge amounts of data (i.e. flows) and it is critical to reduce complexity (i.e. to GF(2)) while allowing the throughput performance of a higher field. As another example, Fulcrum codes are well suited for use within wireless mesh networks, wireless sensor networks, and other dynamic environments due to its simple recoding scheme. As yet another example, Fulcrum codes can be used for distributed storage, allowing recoding and recovery of lost storage devices with simpler operations but maintaining a high reliability.

What is claimed is:

1. In a network having at least a first node and a second node, a method comprising:
   receiving, at the first node, a plurality (n) of source packets;
   encoding the plurality of source packets, using an outer code, to generate a plurality of outer-coded packets and one or more (r) expansion packets, the outer code having a first field size;
   encoding the outer-coded packets and the expansion packets, using an inner code, to generate a plurality of inner-coded packets, the inner code having a second field size;
   transmitting the inner-coded packets from the first node to the second node;
   receiving, at the second node, a plurality of packets transmitted from the first node; and
   decoding the plurality of received packets by one of:
      in response to receiving greater than or equal n and less than n+r packets, decoding the plurality of received packets using the outer code;
      in response to receiving greater than or equal to n+r packets, decoding the plurality of received packets using the inner code; or
      decoding the received packets using the inner code and then, in response to receiving greater than n and less than n+r linearly independent packets, decoding the received packets using the outer code.

2. The method of claim 1 wherein the outer code is systematic and the inner code is systematic.

3. The method of claim 1 wherein the outer code is non-systematic and the inner code is systematic.

4. The method of claim 1 wherein the outer code is systematic and the inner code is non-systematic.

5. The method of claim 1 wherein the outer code is non-systematic and the inner code is non-systematic.

6. The method of claim 1 wherein the first field size and the second field size are powers of two.

7. The method of claim 1 wherein the inner code comprises a Random Linear Network Code (RLNC).

8. The method of claim 1 wherein the inner code comprises a Perpetual network code.

9. The method of claim 1 wherein the inner code comprises a tunable sparse network code.

10. The method of claim 1 wherein the outer code is based upon a shared secret between the first node and the second node.

11. The method claim 1 wherein the outer code is derived using a pseudo-random number generated (PRNG) seed.

12. In a network having at least a first, a second, and a third node, a method comprising:
   receiving, at the first node, a plurality (n) of source packets;
   encoding the plurality of source packets, using an outer code, to generate a plurality of outer-coded packets and one or more (r) expansion packets, the outer code having a first field size;
   encoding the outer-coded packets and the expansion packets, using an inner code, to generate a plurality of inner-coded packets, the inner code having a second field size;
   transmitting the inner-coded packets from the first node to the second node;
   receiving, at the second node, one or more of the inner-code packets;
   recoding, at the second node, the received inner-coded packets using the inner code to generate a plurality of recoded packets by one of:
      in response to receiving less than n packets, recoding the received packets using the inner code; or
      in response to receiving at least n linearly independent packets, decoding the second plurality of received packets using the outer code to recover a second plurality source packets and recoding the recovered packets using the outer code and the inner code to generate a plurality of recoded packets; and transmitting the recoded packets to the third node in the network.

13. A node including:

a processor; and a non-volatile memory storing computer program code that when executed on the processor causes the processor to execute a process operable to:

receive a plurality (n) of source packets;

encode the source packets, using an outer code, to generate a plurality of outer-coded packets and one or more (r) expansion packets, the outer code having a first field size;

encode the outer-coded packets and the expansion packets, using an inner code, to generate a plurality of inner-coded packets, the inner code having a second field size, wherein the second field size is not necessarily equal to the first field size;

transmit the plurality of inner-coded packets to a first remote node;

receive a plurality of packets transmitted from the first remote node; and decode the plurality of received packets by one of;

in response to receiving greater than or equal n and less than n+r packets, decoding the plurality of received packets using the outer code;

in response to receiving greater than or equal to n+r packets, decoding the plurality of received packets using the inner code; or decoding the received packets using the inner code and then, in response to receiving greater than n and less than n+r linearly independent packets, decoding the received packets using the outer code.

14. The node of claim 13 wherein the process is further operable to:

recode the received packets using the inner code to generate a plurality of recoded packets; and transmit the recoded packets to a second remote node.

15. The node of claim 13 wherein the process is further operable to:

decode the received packets using the outer code to recover packets;

recode the recovered packets using the outer code and the inner code to generate a plurality of recoded packets; and transmit the recoded packets to a second remote node.

* * * * *